United States Patent
Drewery et al.

(10) Patent No.: US 9,578,785 B2
(45) Date of Patent: Feb. 21, 2017

(54) ADJUSTABLE BLANKING PANEL FOR DATACENTRE RACKS

(71) Applicant: International Business Machines Corporation, Armonk, NY (US)

(72) Inventors: Sarah M. Drewery, Hursley (GB); Colin I. Holyoake, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 14/302,773

(22) Filed: Jun. 12, 2014

(65) Prior Publication Data

US 2015/0060382 A1 Mar. 5, 2015

(30) Foreign Application Priority Data

Sep. 5, 2013 (GB) .................................. 1315816.7

(51) Int. Cl.
*H05K 7/20* (2006.01)

(52) U.S. Cl.
CPC ...... *H05K 7/20745* (2013.01); *H05K 7/20736* (2013.01); *Y10T 428/24008* (2015.01)

(58) Field of Classification Search
CPC ............ H05K 7/20745; H05K 7/20736; H05K 7/20145; Y10T 428/24008; F15D 1/0005
USPC .................................................. 454/184, 170
IPC ....................................................... H05K 7/20
See application file for complete search history.

(56) References Cited

U.S. PATENT DOCUMENTS

| | | | | |
|---|---|---|---|---|
| 4,334,461 A | * | 6/1982 | Ferguson | F24F 7/00 285/189 |
| 4,880,045 A | * | 11/1989 | Stahler | E06B 9/262 160/207 |
| 4,916,764 A | * | 4/1990 | Meaden | A47K 3/38 160/23.1 |
| 5,080,422 A | * | 1/1992 | DeMonte | B60J 7/062 296/100.12 |

(Continued)

FOREIGN PATENT DOCUMENTS

CN 1881132 A 12/2006
CN 202453792 U 9/2012

(Continued)

OTHER PUBLICATIONS

American Society of Heating, Refrigerating and Air Conditioning Engineers (ASHRAE), https://www.ashrae.org/home/search?k=datacenter, retrieved Jun. 12, 2014, 2 pages.

(Continued)

*Primary Examiner* — Gregory Huson
*Assistant Examiner* — Daniel E Namay
(74) *Attorney, Agent, or Firm* — Francis Lammes; Stephen J. Walder, Jr.; Scott S. Dobson

(57) ABSTRACT

A blanking panel is provided for blocking an aperture in a rack for mounting multiple hardware components. The panel includes: a frame having a first pair of parallel sides connected orthogonally to a second pair of parallel sides, where at least one of the pairs of parallel sides is adjustable in length; an attachment means provided on at least one of the pairs of parallel sides for removable attachment of the blanking panel to the rack; and a screen formed of a flexible and stretchable material extending between at least one of the pairs of parallel sides where the flexible and stretchable material stretches as the pair of parallel sides are moved apart thereby blocking the aperture.

20 Claims, 8 Drawing Sheets

(56) References Cited

U.S. PATENT DOCUMENTS

| | | | | |
|---|---|---|---|---|
| 5,207,256 | A * | 5/1993 | Kraeutler | E06B 9/063 160/264 |
| 5,348,791 | A * | 9/1994 | Thompson | E04B 1/66 428/116 |
| 7,191,555 | B2 * | 3/2007 | Hughes | G09F 15/0025 160/368.1 |
| 7,290,801 | B2 * | 11/2007 | Silverman | B42D 3/04 281/15.1 |
| 7,506,768 | B2 | 3/2009 | Rassmussen et al. | |
| 7,764,495 | B2 * | 7/2010 | Hruby | H05K 7/20572 211/26 |
| 7,782,625 | B2 | 8/2010 | Taylor | |
| 7,878,888 | B2 | 2/2011 | Rasmussen et al. | |
| 8,052,231 | B2 | 11/2011 | Rasmussen et al. | |
| 8,064,962 | B2 * | 11/2011 | Wilcox | G06F 1/1601 455/550.1 |
| 2002/0090980 | A1 * | 7/2002 | Wilcox | G06F 1/1601 455/566 |
| 2004/0221971 | A1 * | 11/2004 | Simon | E06B 3/481 160/206 |
| 2004/0232098 | A1 | 11/2004 | Orr | |
| 2006/0194619 | A1 * | 8/2006 | Wilcox | G06F 1/1601 455/566 |
| 2009/0027852 | A1 * | 1/2009 | Roesner | H05K 7/20136 361/690 |
| 2010/0000953 | A1 | 1/2010 | Shew et al. | |
| 2010/0201230 | A1 * | 8/2010 | Schweitzer, III | H02B 1/50 312/107 |
| 2011/0175505 | A1 | 7/2011 | Linhares, Jr. et al. | |
| 2011/0240573 | A1 | 10/2011 | Sempliner et al. | |
| 2012/0091090 | A1 | 4/2012 | Larsen et al. | |
| 2012/0134110 | A1 | 5/2012 | Chang | |
| 2012/0162904 | A1 * | 6/2012 | Chan | G06F 1/181 361/679.48 |
| 2013/0062047 | A1 | 3/2013 | Vaney et al. | |
| 2013/0133843 | A1 * | 5/2013 | Kraeutler | E06B 9/0692 160/188 |
| 2013/0273825 | A1 * | 10/2013 | Uno | H05K 7/20745 454/184 |
| 2014/0148086 | A1 * | 5/2014 | Cash | H05K 7/20736 454/184 |
| 2014/0287670 | A1 * | 9/2014 | Lin | H05K 7/20745 454/184 |
| 2014/0301035 | A1 * | 10/2014 | Fan | H05K 7/20736 361/679.46 |
| 2015/0305202 | A1 * | 10/2015 | Veino | H05K 7/20709 361/679.46 |

FOREIGN PATENT DOCUMENTS

| | | | | |
|---|---|---|---|---|
| CN | 102934534 | A | 2/2013 | |
| CN | 103208234 | A | 7/2013 | |
| FR | EP 0501881 | A1 * | 9/1992 | E06B 9/0692 |
| WO | WO2010/005556 | A1 | 1/2010 | |

OTHER PUBLICATIONS

Search Report under Section 17(5) dated Feb. 21, 2014, Application Serial No. GB1315816.7, 3 pages.

"Blanking Panels and Rack Airflow Management", http://www.edpeurope.com/en/products/airflow-management/blanking-panels, Jul. 6, 2013, 2 pages.

Expandable Filler Panels—84"h", Data Clean Corporation, http://www.dataclean.com/expandable-filler-panels.htm, 2014, retrieved Apr. 25, 2014, 1 page.

"PlenaFill Scalable Blanking Panels for 19" & 23" EIA Racks", PlenaForm Systems, http://plenaform.com/plenafill/, retrieved Jul. 6, 2012, 2 pages.

"Rack Accessories: Quick Fit Adjustable Depth Switch/Server Side Blanking Panels", Cooper B-Line, http://www.cooperbline.co.uk/ass_ra_panels_quickfitadjust.aspx, 2009, retrieved Apr. 25, 2014, 3 pages.

Moss, David L. et al., "Rack Blanking Panels—To Fill or Not to Fill", Dell Inc., http://www.dell.com/downloads/global/products/pedge/en/dell-white-paper-en.pdf, A Dell Technical White Paper, Feb. 2011, 9 pages.

Vor Dem Berge, Micha, "D3.1 First definition of the flexible rack-level compute box with integrated cooling", Platform for optimizing the design and operation of modular configurable IT infrastructures and facilities with resource-efficient cooling, http://ec.europa.eu/information_society/apps/projects/logos/1/288701/080/deliverables/001_Ares2012390908CoolEmAIID31.

* cited by examiner

ADJUSTABLE BLANKING PANEL FOR DATACENTRE RACKS

BACKGROUND

This invention relates to the field of blanking panels for datacentre racks. In particular, the invention relates to an adjustable blanking panel for datacentre racks.

Datacenters are reliant on appropriate airflow to keep servers and infrastructure cool and operating within known system limits. Some servers have to run within certain temperature thresholds otherwise system degradation may occur.

Datacenters typically use rows of racks with cold and hot aisles, whereby at the front of the rack, cold air is blown up from a raised floor into the path of the fans of the servers contained within the rack. The cold air is sucked through the server, heated (via the natural process of the internal components) and then pushed out the rear of the rack into the hot row.

In order for devices to work efficiently, the air supplied needs to be at a constant temperature. Currently hot and cold air can mix in any unfilled spaces between devices in the racks, warming the cold air supplied to the devices. The temperature of the cold air rises forcing devices to work harder to maintain a constant temperature. In turn, this affects the efficiency of the datacentre (as described in the points below) as well as the local environment due to extra power usage and the site carbon footprint. The cost of running a room with set temperatures and humidity is high as air conditioning and fan speeds all add to the general electrical use of the room. This is now a global problem with datacenters often measured on a Power Usage Effectiveness (PUE) scale and CO2 based levels.

Higher supply temperatures are also a factor in causing the following problems:

Premature component failure;
Reduced processing power by going into a state of degradation;
Hotter exhausts which the room air conditioning handlers (computer room air conditioning (CRAC) units) have to try lower to maintain room environment, potentially exceeding room capacity;
More electrical usage by a server to ramp-up fans and cooling technologies; and
More electrical usage by datacenter air handlers to ramp-up fans to supply suitable temperatures.

To prevent air mixing, rack panels (also known as blanking panels) are used to fill any voids within the rack to prevent air circulation or mixing. There are several versions typically supplied by original equipment manufacturers (OEMs).

Current blanking panels are typically of standard sizes and do not fill non-standard spaces and thus cannot reduce mixing within these spaces. The term "U" is an industry set space within a typical rack.

Existing known blanking panels have the following problems:

Blanking panels are traditionally fixed 1 U or 3 U sizes, and cannot combat odd spaces, for example, a third of a U, or at the side of a system.
They are solid, made with thick plastic, metal or other solid material, which causes issues with storage when they are not installed in the rack, often resulting in many datacenter owners throwing them out, later finding they should have installed the panels.
Existing blanking panels only block the horizontal spaces and leave any vertical spaces empty.
They cannot bend round shapes, for implementations of rack furniture that do not use standard installations.
All prior art blanking panels require connections on both sides of the rack.

Therefore, there is a need in the art to address the aforementioned problems.

SUMMARY

In one illustrative embodiment, a blanking panel is provided for blocking an aperture in a rack for mounting multiple hardware components. In the illustrative embodiment, the blanking panel comprises a frame having a first pair of parallel sides connected orthogonally to a second pair of parallel sides, where at least one of the pairs of parallel sides is adjustable in length. In the illustrative embodiment, the blanking panel comprises an attachment means provided on at least one of the pairs of parallel sides for removable attachment of the blanking panel to the rack. In the illustrative embodiment, the blanking panel comprises a screen formed of a flexible and stretchable material extending between at least one of the pairs of parallel sides, where the flexible and stretchable material stretches as the pair of parallel sides are moved apart thereby blocking the aperture.

In another illustrative embodiment, a rack is provided for mounting multiple hardware components including vertical sides and at least one shelf for supporting the hardware components. In the illustrative embodiment, a blanking panel is provided for blocking an aperture in the rack in which no hardware component is housed. In the illustrative embodiment, the blanking panel comprises a frame having a first pair of parallel sides connected orthogonally to a second pair of parallel sides, where at least one of the pairs of parallel sides is adjustable in length. In the illustrative embodiment, the blanking panel comprises an attachment means provided on at least one of the pairs of parallel sides for removable attachment of the blanking panel to the rack. In the illustrative embodiment, the blanking panel comprises a screen formed of a flexible and stretchable material extending between at least one of the pairs of parallel sides, where the flexible and stretchable material stretches as the pair of parallel sides are moved apart thereby blocking the aperture.

In yet another illustrative embodiment, a method is provided for blocking apertures in a rack for mounting multiple hardware components. The illustrative embodiment provides a blanking panel that comprises a frame having a first pair of parallel sides connected orthogonally to a second pair of parallel sides, where at least one of the pairs of parallel sides is adjustable in length; an attachment means provided on at least one of the pairs of parallel sides for removable attachment of the blanking panel to the rack; and a screen formed of a flexible and stretchable material extending between at least one of the pairs of parallel sides, wherein the flexible and stretchable material stretches as the pair of parallel sides are moved apart thereby blocking the aperture. The illustrative embodiment attaches a first side of the frame of the panel to a portion of the rack adjacent a first side of the aperture. The illustrative embodiment extends a second side of the frame opposite to the first side to a second side of the aperture thereby stretching the screen of the panel to cover the aperture. The illustrative embodiment attaches the second side of the frame to a portion of the rack adjacent the second side of the aperture.

The described aspects of the invention provide the advantage of providing blanking panels to support non-standard rack items, and non-complete U sized spaces. This has the advantage of reducing hot and cold air mixing within the racks, preventing compromised airflows, and helping the site 'green' stance. These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings.

Preferred embodiments of the present invention will now be described, by way of example only, with reference to the following drawings in which.

DETAILED DESCRIPTION

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

An adjustable blanking panel for filling spaces in a rack of a datacentre is provided. The adjustable blanking panel is a versatile blanking panel able to be expanded or contracted to fill standard and non-standard spaces in a rack. Spaces in a rack may be caused by hardware components being stored in the rack which are not standard sizes. The described blanking panel may also provide a "sock" and/or seal around racked devices to aid airflow.

The described adjustable blanking panel has an adjustable frame that encompasses or surrounds a stretchable material. For example, the stretchable material may be rubber latex, polychloroprene, or a nylon fabric. The frame may be removably attached to the rack, for example, by clips or bolts between the frame and the rack.

The adjustable frame may have at least two opposing adjustable sides. The other two opposing sides may be of fixed dimensions, detachable, or also adjustable.

At time for installation, one side of the frame may be clipped or bolted to the rack, and the panel pulled to the opposite side of the space in the rack, thus stretching the internal material across the space's void. In addition, the same may carried out in the orthogonal direction attaching a third side of the frame to the rack and extending the fourth side.

Figure 1:
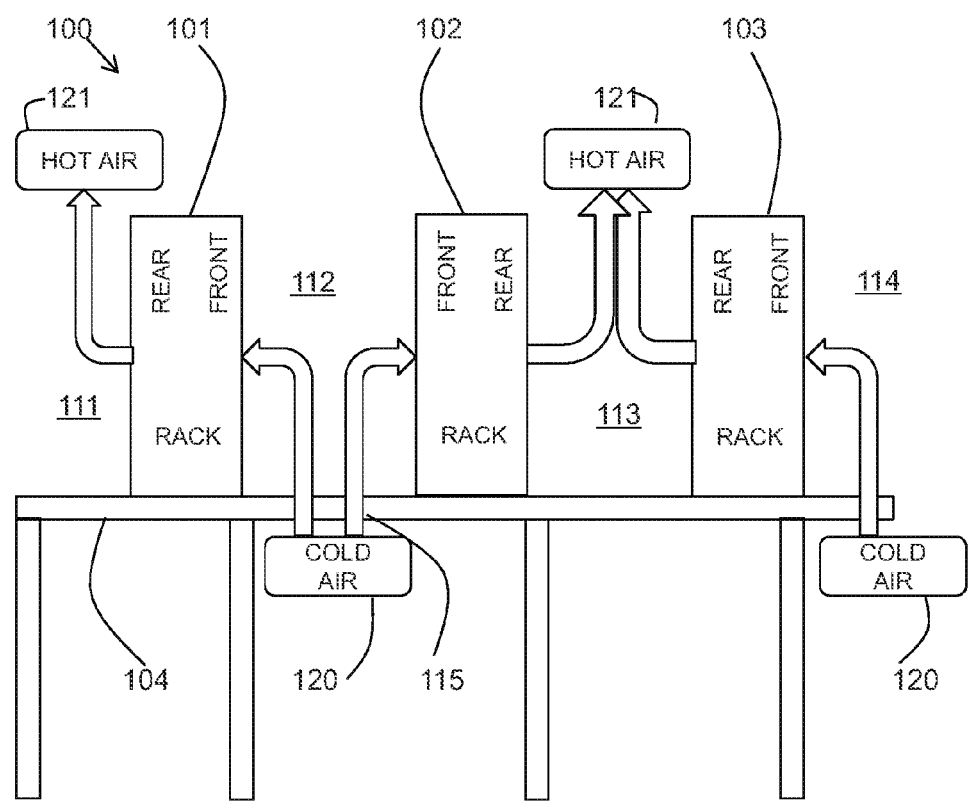
FIG. 1 is cross-sectional view of a datacentre as known in the prior art.

Referring to FIG. 1, a datacentre 100 is shown in cross-section as known in the prior art. A datacentre 100 typically has multiple racks 101, 102, 103 for housing hardware components. The racks 101-103 are often mounted on a raised floor 104 having perforated tiles so that an under-floor cold air supply can be provided between the racks 101-103.

A typical arrangement is to have alternating cold aisles 112, 114 and hot aisles 111, 113 between the racks 101-103. The racks 101-103 may be arranged so that their fronts face a cold aisle 112, 114 and their backs face a hot aisle 111, 113. The perforated tiles or other form of air inlet 115 from the raised floor 104 are positioned below the cold aisles 112, 114.

In practice, the cold air rises 120 through the raised floor into the cold aisles 112, 114 and cools the fronts of the racks 101-103. Hot air may be expelled from the back of the racks 101-103 into the hot aisles 111, 113 where it rises 121 and dissipates.

Figure 2A:
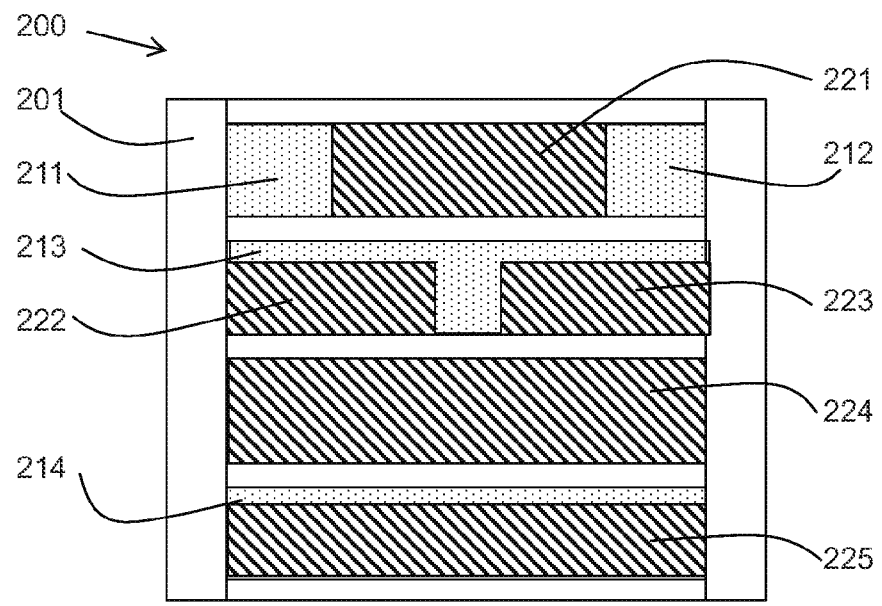
FIG. 2A is a schematic diagram showing a front view of a rack in a datacentre having spaces as known in the prior art.

Referring to FIG. 2A, a schematic diagram 200 shows a front view of a rack 201. A rack 201 has vertical supports and, typically, regularly positioned horizontal shelves on which hardware components may be mounted. The hardware components (shown with diagonal hashing fill) 221-225 may include hardware components which are non-standard sizes and therefore do not fit snuggly in the rack 201 on the horizontal shelves leaving spaces or apertures (shown with dotted fill) 211-214 at the sides and tops of some of the hardware components 221-225.

Figure 2B:
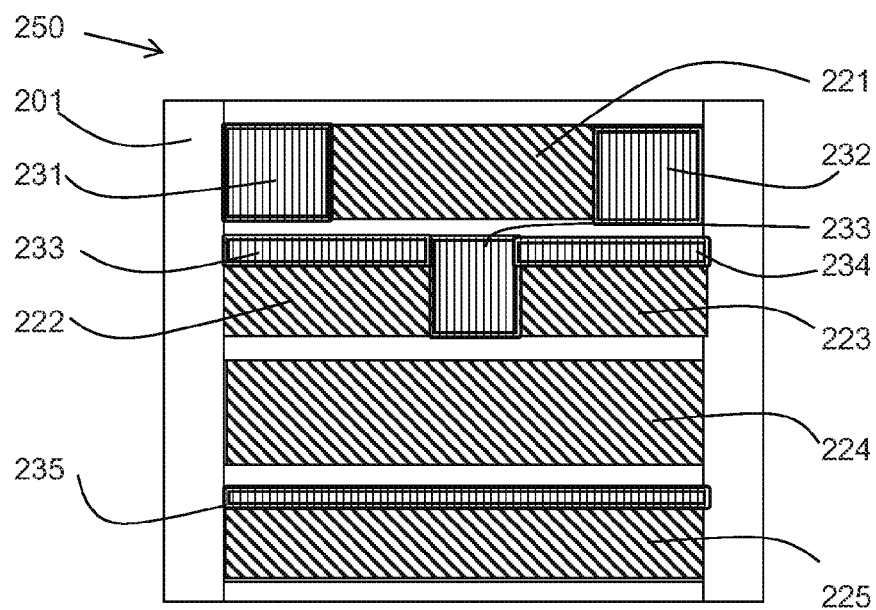
FIG. 2B is the schematic diagram of FIG. 2A, showing blanking panels in accordance with the present invention.

FIG. 2B shows a schematic diagram 250 of the rack 201 of FIG. 2A with adjustable blanking panels 231-235 as described herein filling the spaces 211-214 between the hardware components 221-225. The adjustable blanking panels 231-235 may be positioned in the front vertical plane of the rack 201 which is typically facing a cold aisle which is ventilated with cold air.

Referring to FIGS. 3A and 3B, 4A, 4B and 4C, 5A and 5B, three example embodiments are shown of an adjustable blanking panel. All three embodiments have a panel 300, 400, 500 having a frame 301 and an internal screen formed of a flexible, expandable material 302.

Figure 3A:
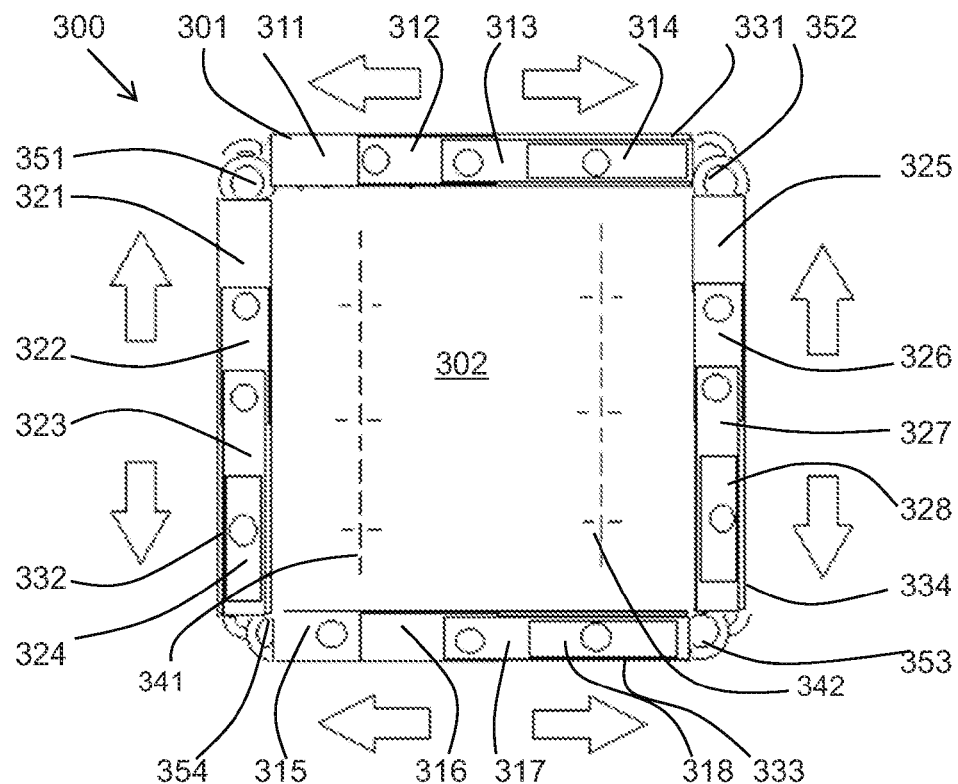
FIGS. 3A and 3B are diagrams showing a first embodiment of a blanking panel in accordance with the present invention in an expanded and a contracted position.
Figure 3B:
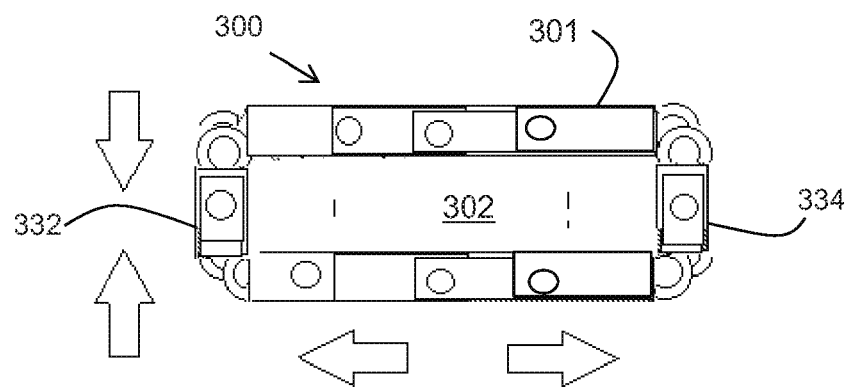

FIGS. 3A and 3B shows a first example embodiment of a panel 300 in which the frame 301 is provided in the form of adjustable clips 311-318, 321-328 on each of the four sides 331-334 of the frame 301. In the example illustrated, three sliding clips 311-318, 321-328 may be provided on each side 331-334 of the frame 301 and may be expanded or contracted (as shown by the block arrows) by sliding the clips and locking them in different positions.

The panel 300 may have attachment means 351-354 at each corner of the frame 301 for attachment to the rack. In this example, the attachment means 351-354 are shown in the form of eyelets which may be attached to a rack by bolts.

FIG. 3A shows the panel 300 in an expanded form with all four sides 331-334 extended. FIG. 3B shows the panel in a contracted form with two opposite sides 332, 334 contracted.

The first embodiment shown in FIGS. 3A and 3B shows an optional feature of the internal material 302 having slits 341, 342 or an opening to enable the material 302 to stretch around a hardware component to provide a tight seal. Further details of this aspect are shown in later figures. The slits 341, 342 may have a perpendicular pattern (for example, as shown as a multiple cross, as an I shape, or as a diagonal cross) to accommodate a hardware component.

In one example, a frame 301 may be adjustable from ⅓ of a U (three holes per U) to the limit of the expandable frame.

Figure 4A:
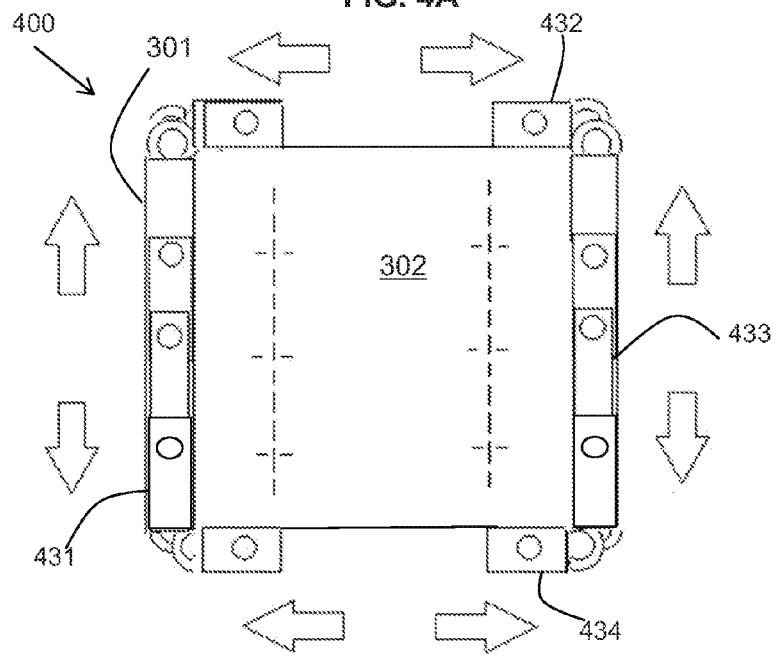
FIGS. 4A, 4B and 4C are diagrams showing a second embodiment of a blanking panel in accordance with the present invention in expanded and contracted positions.
Figure 4B:
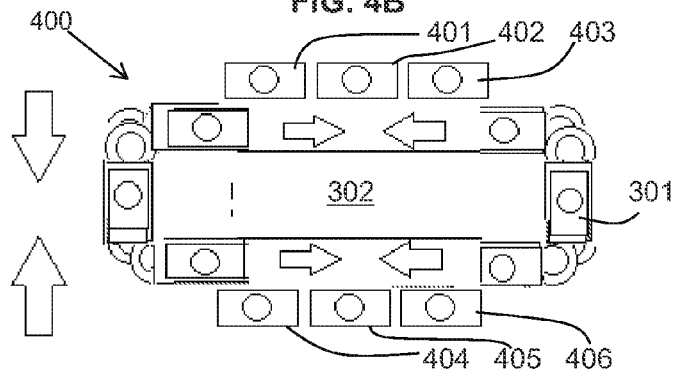
Figure 4C:
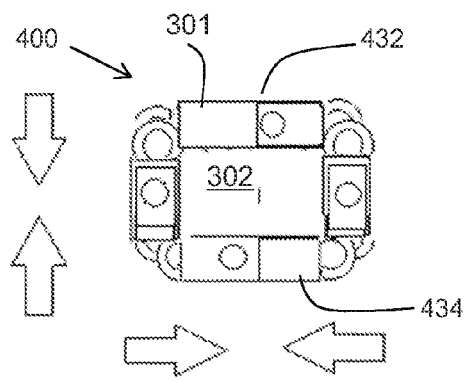

FIGS. 4A, 4B and 4C show a second example embodiment of a panel 400. This is similar to the panel 300 of the first embodiment, with the difference that two opposite sides 432, 434 are detachable or separable enabling the panel 400 to only be attached to a rack on two opposing sides 431, 433. This enables the panel 400 to be stretched beyond the limit of the length of its sides to reach across a wide space in a rack. FIG. 4B shows that some of the sections 401-406 forming the frame 301 may be completely removed, resulting in panel 400 of FIG. 4C.

Datacentre racks generally have bolt holes on either side of the rack (usually three holes per U), which would allow the panel 400 to be bolted in all four corners providing the covering of the space as required. Subject to the expandable material 302 of the screen, the airflow may create a small sail-type effect by puffing out the material which may bridge any gaps around the material 302.

Figure 5A:
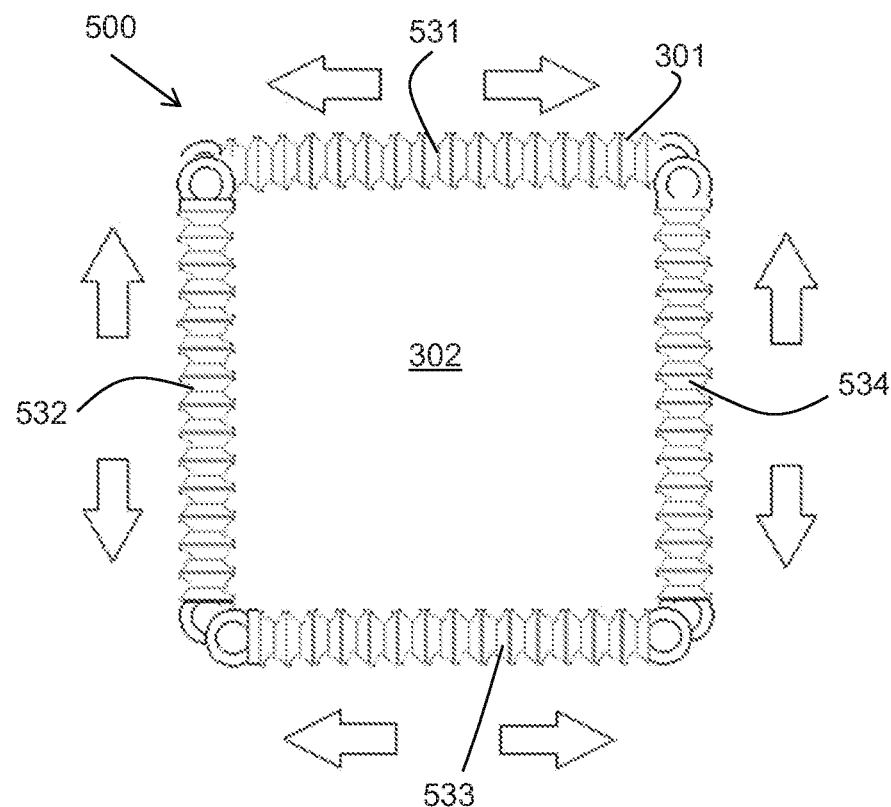
FIGS. 5A and 5B are diagrams showing a third embodiment of a blanking panel in accordance with the present invention in an expanded and a contracted position.
Figure 5B:
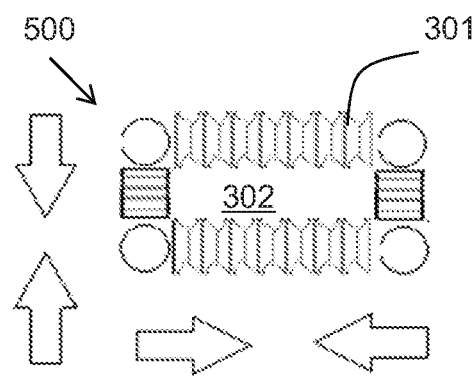

FIGS. 5A and 5B show a third example embodiment of a panel 500. In this embodiment, the frame 301 is provided with adjustable sides 531-534 which have a concertina form (for example, similar to a "bendy straw") to allow expansion and contraction. The adjustable sides 531-534 may have a concertina form of a semi-circular cross-section allowing maximum contact and strength with the rack and ensuring an air-tight fit. The sides 531-534 may have sliders and locks on the rear, flat side of the frame sides 531-534 to hold the sides 531-534 in the desired expansion or contraction.

Figure 6A:
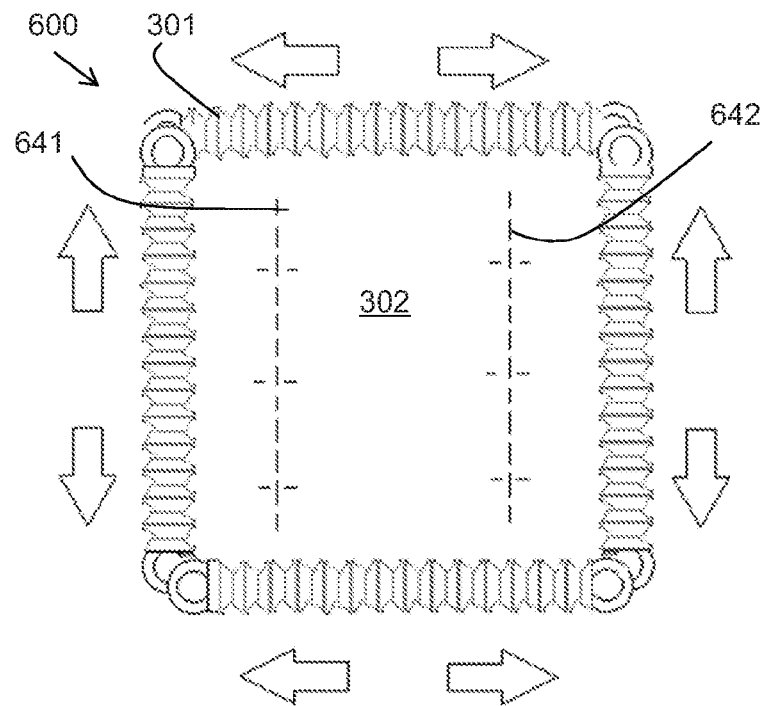
FIGS. 6A and 6B are diagrams showing a fourth embodiment of a blanking panel in accordance with the present invention in a vertical and a horizontal position.
Figure 6B:
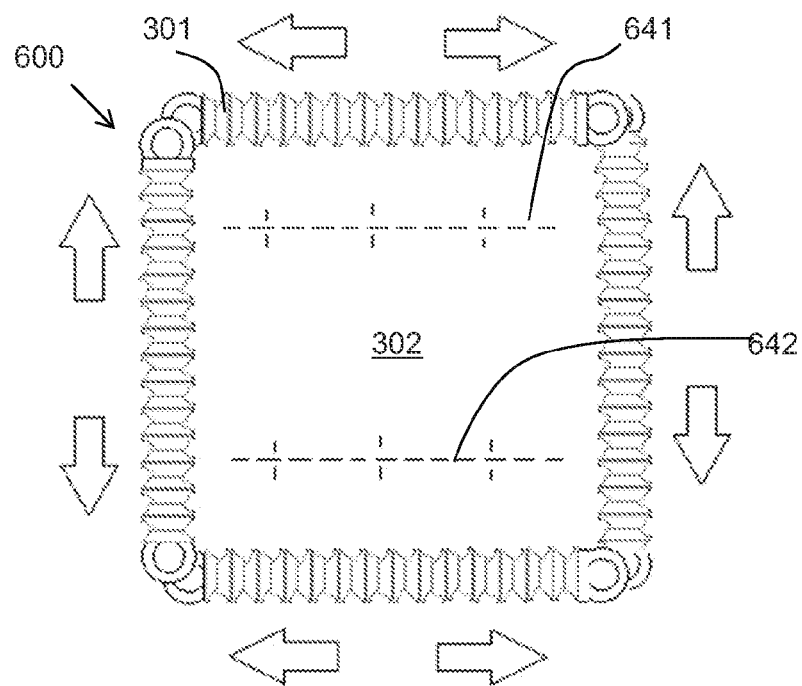

The third embodiment does not show the optional slits in the material 302, however, theses may also be provided with this embodiment as shown in FIGS. 6A and 6B.

Referring to FIGS. 6A and 6B, a panel 600 having a frame 301 and internal material 302 may include slits 641, 642 and the panel 600 may be rotated to position the slits 641, 642 appropriately for a given hardware component.

Figure 7A:
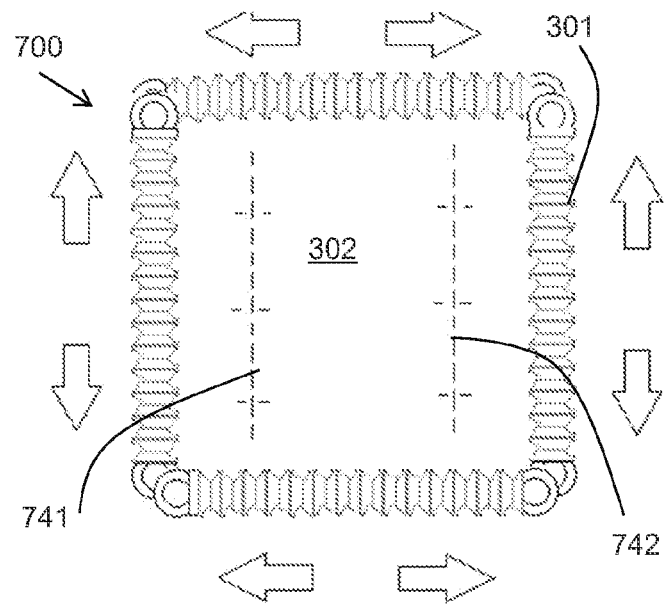
FIGS. 7A, 7B and 7C are diagrams showing the fourth embodiment of a blanking panel in accordance with the present invention in an expanded and a contracted position and as a side cross-sectional view.
Figure 7B:
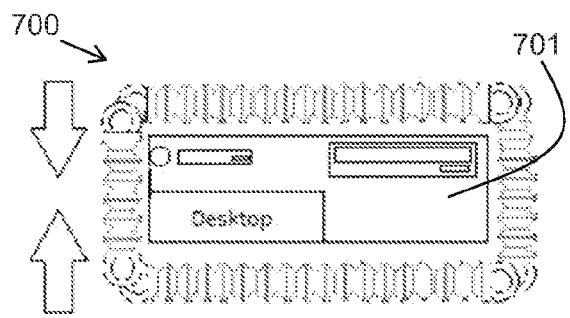
Figure 7C:
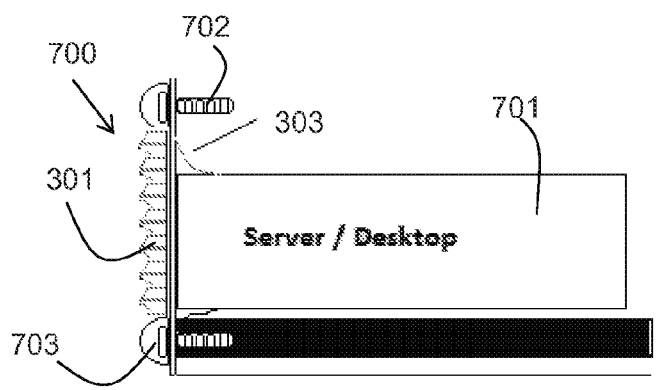

Referring to FIGS. 7A, 7B and 7C, a panel 700 having a frame 301 and internal material 302 may include slits 741, 742 and the panel 700 may be rotated to position the slits 741, 742, and then contracted (FIG. 7B) to accommodate a hardware component 701. FIG. 7C shows a side view of the hardware component 701 with the material 302 stretching around the hardware component 701 providing a seal.

The internal material 302 having slits or cut-outs enables a surround or sock affect to occur to provide as much of an air tight seal 303 as possible. This is similar to vacuum forming, whereby an object is pushed through providing a seal.

FIG. 7C also shows bolts 702, 703 attaching the frame 301 to the rack.

The frame may be adjusted to cover a wide range of spaces. Multiple panels are traditionally used on one rack and this would not change. However, the described adjustable panels may be installed where previous forms of rack panels would not fit.

Due to the collapsible frame, storage space required for the adjustable panel when it is not in use is minimal.

With purpose added slits within the material, an adjustable panel allows a non-standard hardware components (for example, desktops/towers) to be racked within a traditional 19″ rack without exposing considerable gaps and compromising airflow.

The adjustable panel may be scaled to a very small unit for small spaces in a rack.

In a further embodiment, there may be provided an additional material that can also stretch with the inner material with suitable eyelets for installation into rack.

A frame of a panel surrounding the screen of flexible material may be sufficiently stable that it supports the material in a given position of expansion/contraction of the frame. The panel may be installed with not all four corners attached to a rack; however, once the frame is expanded and locked at a selected size, the frame may be sufficiently rigid or have friction enough to support the material. This would provide a method to block gaps vertically and horizontally without support from the opposite side of the rack. For example, this arrangement may be used in an arrangement of a desktop that fits snuggly between two shelves with gaps on either side.

Figure 8A:
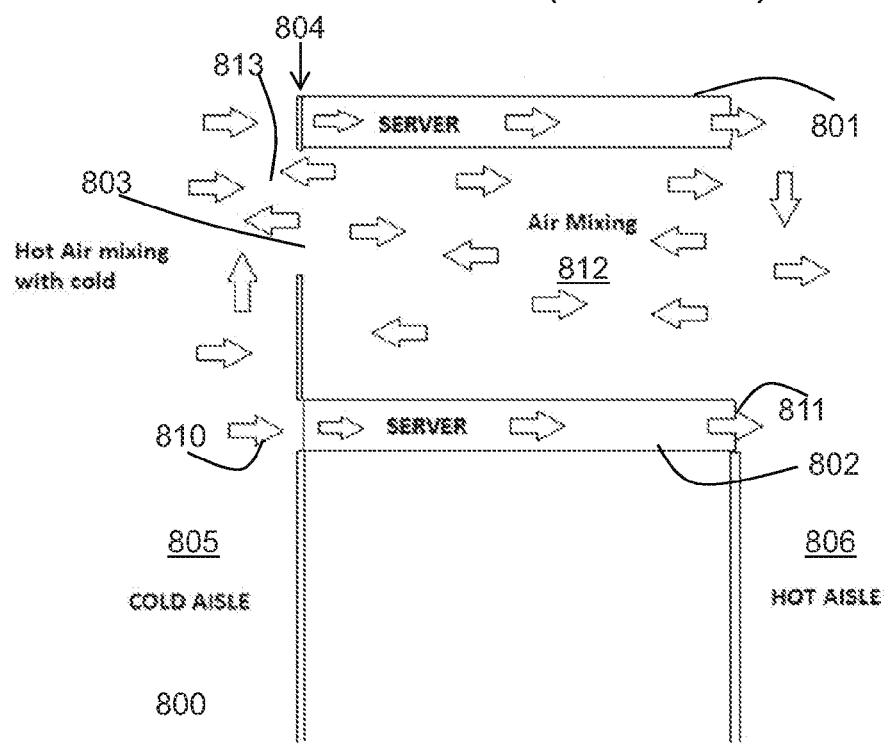
FIG. 8A is a schematic diagram showing the airflow in a rack having an open space as known in the prior art.
Figure 8B:
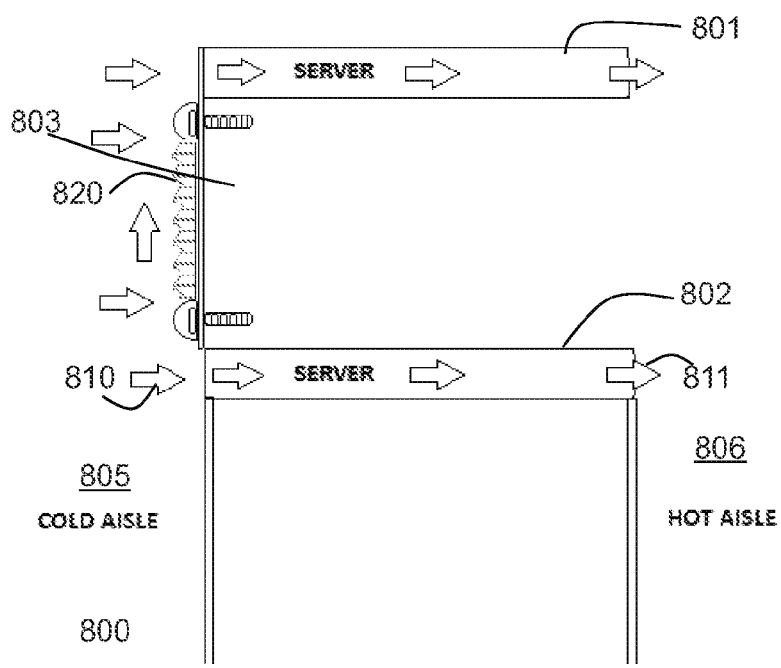
FIG. 8B is a schematic diagram showing the rack of FIG. 8A have a blanking panel and the associated airflow.

Referring to FIGS. 8A and 8B, a schematic cross-section of a rack 800 is shown with two servers 801, 802 and a space 803 in the front 804 of the rack 800 adjacent a cold aisle 805. The servers 801, 802 suck in cold air 810 from the cold aisle 805 and expel hot air 811 from the rear of the servers 801, 802 into a hot aisle 806.

In FIG. 8A, no panel is used to fill the space 803 and therefore hot air may mix 812 from the hot aisle 806 inside the rack 800 and escape 813 through the space 803 into the cold aisle 805 where it mixes with the cold air. The servers 801, 802 therefore receive warmer air and their fans must work harder to maintain system temperature.

FIG. 8B, shows an adjustable panel 820 used to cover the space 803. The adjustable panel 820 is attached to the rack 800 by bolts and stretched to fill the space 801. Now, cold air 810 from the cold aisle 805 may enter the servers 801, 802 and be expelled 811 into the hot aisle 806. The hot air does not mix within the rack and is not allowed to find its way back to the cold aisle 805. Therefore, the air in the cold aisle 805 remains cold and effective cooling is carried out.

The described adjustable panels for datacentre racks have the following advantages:
  Help datacentre owners meet heating and ventilation standards;
  Save money and decrease carbon footprint of a datacentre;
  Less packaging and storage space needed;
  Better seals around non-standard shaped equipment;
  Reusable;

Could become industry standard for catering for non-standard equipment;

Longer machine life as running at cooler temperature.

Improvements and modifications can be made to the foregoing without departing from the scope of the present invention.

The invention claimed is:

1. A blanking panel for blocking an aperture in a data center rack for mounting multiple hardware components, the panel comprising:
   a frame having a first pair of parallel sides connected orthogonally to a second pair of parallel sides, wherein at least one of the pairs of parallel sides is adjustable in length;
   an attachment means provided on at least one of the pairs of parallel sides for removable attachment of the blanking panel to the data center rack; and
   a screen formed of a flexible and stretchable material extending between at least one of the pairs of parallel sides, wherein the flexible and stretchable material stretches as the pair of parallel sides are moved apart thereby blocking the aperture.

2. The blanking panel as claimed in claim 1, wherein the frame encompasses the screen and wherein the flexible and stretchable material stretches to accommodate relative movement of both of the pairs of parallel sides.

3. The blanking panel as claimed in claim 1, wherein one of the pairs of parallel sides is formed of detachable members leaving two sides of the flexible and stretchable material exposed.

4. The blanking panel as claimed in claim 1, wherein both of the pairs of parallel sides are adjustable in length.

5. The blanking panel as claimed in claim 1, wherein the flexible and stretchable material includes an opening which, in use, is stretched around a hardware component housed in the data center rack.

6. The blanking panel as claimed in claim 5, wherein the opening is formed as an arrangement of slits in the flexible and stretchable material which are capable of stretching, in use, to accommodate the hardware component in an air-tight fit.

7. The blanking panel as claimed in claim 1, wherein the pairs of parallel sides have adjusting means in the form of concertina elements having a flat rear surface.

8. The blanking panel as claimed in claim 1, wherein the pairs of parallel sides have adjusting means in form of sliding elements.

9. The blanking panel as claimed in claim 1, wherein the pairs of parallel sides have fixing means for fixing the sides at a selected length.

10. The blanking panel as claimed in claim 9, wherein the fixing means locks the frame at a selected size and wherein the frame is sufficiently rigid to hold the panel in place without attachment at all four corners.

11. The blanking panel as claimed in claim 1, wherein the flexible and stretchable material is formed of one of the group of: rubber latex, polychloroprene, or a nylon fabric.

12. A data center rack for mounting multiple hardware components including vertical sides and at least one shelf for supporting the hardware components, and comprising:
   a blanking panel for blocking an aperture in the data center rack in which no hardware component is housed, wherein the blanking panel comprising:
   a frame having a first pair of parallel sides connected orthogonally to a second pair of parallel sides, wherein at least one of the pairs of parallel sides is adjustable in length;
   an attachment means provided on at least one of the pairs of parallel sides for removable attachment of the blanking panel to the data center rack; and
   a screen formed of a flexible and stretchable material extending between at least one of the pairs of parallel sides wherein the flexible and stretchable material stretches to cover the aperture as the pair of parallel sides are moved apart thereby blocking the aperture.

13. The data center rack as claimed in claim 12, wherein the frame encompasses the screen and wherein the flexible and stretchable material stretches to accommodate relative movement of both of the pairs of parallel sides.

14. The data center rack as claimed in claim 12, wherein one of the pairs of parallel sides is formed of detachable members leaving two sides of the flexible and stretchable material exposed.

15. The data center rack as claimed in claim 12, wherein the flexible and stretchable material includes an opening which, in use, is stretched around a hardware component housed in the data center rack, wherein the opening is formed as an arrangement of slits in the flexible and stretchable material which are capable of stretching, in use, to accommodate the hardware component in an air-tight fit.

16. The data center rack as claimed in claim 12, wherein the pairs of parallel sides have adjusting means in the form of concertina elements having a flat rear surface.

17. The data center rack as claimed in claim 12, wherein the pairs of parallel sides have adjusting means in the form of sliding elements.

18. The data center rack as claimed in claim 12, wherein the pairs of parallel sides have fixing means for fixing the sides at a selected length and wherein the fixing means locks the frame at a selected size and wherein the frame is sufficiently rigid to hold the panel in place without attachment at all four corners.

19. A method for blocking an aperture in a data center rack for mounting multiple hardware components, comprising:
   providing a blanking panel, wherein the blanking panel comprises a frame having a first pair of parallel sides connected orthogonally to a second pair of parallel sides, wherein at least one of the pairs of parallel sides is adjustable in length; an attachment means provided on at least one of the pairs of parallel sides for removable attachment of the blanking panel to the data center rack; and a screen formed of a flexible and stretchable material extending between at least one of the pairs of parallel sides, wherein the flexible and stretchable material stretches as the pair of parallel sides are moved apart thereby blocking the aperture;
   attaching a first side of the frame of the panel to a portion of the data center rack adjacent a first side of the aperture;
   extending a second side of the frame opposite to the first side to a second side of the aperture thereby stretching the screen of the panel to cover the aperture; and
   attaching the second side of the frame to a portion of the data center rack adjacent the second side of the aperture.

20. The method as claimed in claim 19, further comprising:
   attaching a third side of the frame of the panel to a portion of the data center rack adjacent a third side of the aperture;
   expending a fourth side of the frame opposite to the third side to a fourth side of the aperture; and attaching the fourth side of the frame to a portion of the data center rack adjacent a fourth side of the aperture.

* * * * *